United States Patent [19]

Friedman et al.

[11] Patent Number: 4,757,269
[45] Date of Patent: Jul. 12, 1988

[54] MULTI-GIGAWATT HIGH-EFFICIENCY RF AMPLIFIER

[75] Inventors: Moshe Friedman, Washington, D.C.; Victor Serlin, Springfield, Va.

[73] Assignee: The United States of America as represented by the Secretary of the Navy, Washington, D.C.

[21] Appl. No.: 943,011

[22] Filed: Dec. 18, 1986

[51] Int. Cl.[4] .............................................. H03F 3/54
[52] U.S. Cl. ........................................ 330/47; 330/44
[58] Field of Search ................... 330/43, 44, 45, 46, 330/47

[56] References Cited

U.S. PATENT DOCUMENTS 3,812,395 5/1974 Scott ...................................... 330/43

OTHER PUBLICATIONS

Publication, Emission of Intense Microwave Radiation from an Automodulated Relativistic Electron Beam by M. Friedman, *Applied Physics Letters*, vol. 26, No. 7, 1 Apr. 1975, pp. 366–368.
Publication, Propagation of Intense Relativistic Electron Beams Through Drift Tubes with Perturbed Walls, M. Friedman et al., *Physical Review Letters*, vol. 50, No. 24, 13 Jun. 1983, pp. 1922–1925.
Publication, Conversion of the Energy of Intense Relativistic Electron Beams into High-Power Electrical Pulses, M. Friedman et al., *Rev. Sci. Instrum.* 54(12), Dec. 1983, pp. 1764–1766.
Publication, Self-Modulation of an Intense Relativistic Electron Beam, M. Friedman et al., *Journal of Applied Physics* 56(9), 1 Nov. 84, pp. 2459–2474.

*Primary Examiner*—Gene Wan
*Attorney, Agent, or Firm*—Thomas E. McDonnell; Andrew M. Lesniak

[57] ABSTRACT

An RF amplifier wherein an IREB interacts with RF energy from an RF energy source coupled via an RF cavity to a tube drift region where the IREB is modulated at the frequency of the RF energy source, to provide high gain amplification at high power and high efficiency.

21 Claims, 3 Drawing Sheets

MULTI-GIGAWATT HIGH-EFFICIENCY RF AMPLIFIER

BACKGROUND OF THE INVENTION

This invention relates to a Radio Frequency (RF) amplifier utilizing an intense relativistic electron beam (IREB) and more particularly to an RM amplifier utilizing an IREB modulated by an RF signal.

High power (e.g., $10^9$ Watts), high efficiency (e.g., 50%) RF amplifiers with high gain (e.g., 40 db), capable of operating in a frequency range including frequencies up to a specified frequency (e.g., up to 10 Gigahertz) are currently sought for various applications. Large particle accelerators, for example, can be driven by such an amplifier.

Commercially available high power RF amplifiers, such as klystrons, operate at power levels not exceeding about 100 megawatts with an efficiency on the order of 50%.

OBJECTS OF THE INVENTION

One object of the invention is to provide a high power, high efficiency RF amplifier with high gain, utilizing a high amount of intense relativistic electron beam to achieve high gain amplification of an input RF signal.

Another object of the invention is to provide an RF amplifier having an RF source coupled through an RF cavity, via a gap, to a drift region of an evacuated tube wherein an IREB is modulated at the RF source frequency through interaction of RF source energy with the IREB at the gap.

Another object of the invention is to provide an RF amplifier having an RF source coupled to an RF cavity coupled, via a gap, to a drift region of an evacuated tube where an IREB is premodulated at the RF source frequency through interaction of RF source energy with the IREB at the gap, and to provide another RF cavity coupled, via another gap, to the IREB to further modulate the IREB.

The invention provides a combination for amplifying an input signal of a particular radio frequency in which an RF source (e.g. a magnetron) coupled to an RF cavity coupled via a gap to a propagating IREB in an evacuated drift region provides RF source energy at the gap that interacts with the IREB to achieve a modulated IREB at the radio frequency of the source. The invention also provides such a combination in which a second RF cavity and gap located downstream of the first RF cavity, at a position where IREB modulation is optimum, greatly enhances the extent of overall beam modulation.

In accordance with the invention, the high current of IREB makes the device work in a region where the plasma frequency is higher than the operating frequency: when this is achieved in the apparatus described herein the following happens:

(1) Electron beam modulation occurs at the point of excitation, (2) long drift regions for beam bunching are not necessary.

(3) a high modulated current is achieved resulting in low beam impedance making the extracting of power device to be of low "Q" e.g. transmission lines. This in time shortened the fill time of the output device making it possible to generate short RF pulses with a fast rise time.

BRIEF DESCRIPTION OF THE PREFERRED EMBODIMENT

Figure 1:
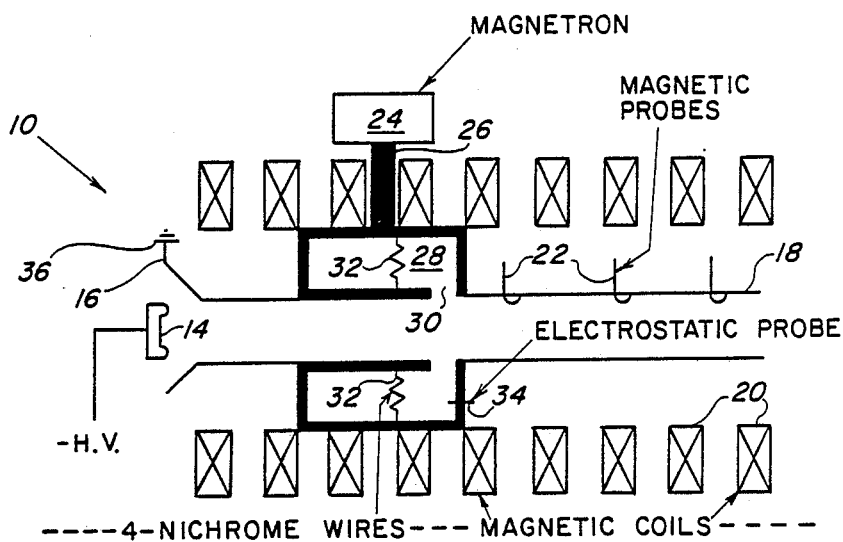
FIG. 1 is a schematic diagram of one combination embodying the invention.

FIG. 1 schematically represents a first apparatus 10 including a cathode 14, an anode 16, an elongated drift tube 18, magnetic coils 20 surrounding the tube 18, magnetic probes 22 protruding into the tube 18, an RF source 24 (i.e., a magnetron), a waveguide 26 coupling the source 24 to an annular RF cavity 28, coaxial with a drift region in the tube 18, a circular gap 30 coupling the cavity 28 to the drift region in the tube 18, four symmetrically arranged resistance elements 32 made of nichrome wire (only two are shown), an electrostatic probe 34, a voltage source —H.V., connected to cathode 14, and a ground connection 36 connected to anode 14.

Figure 2:
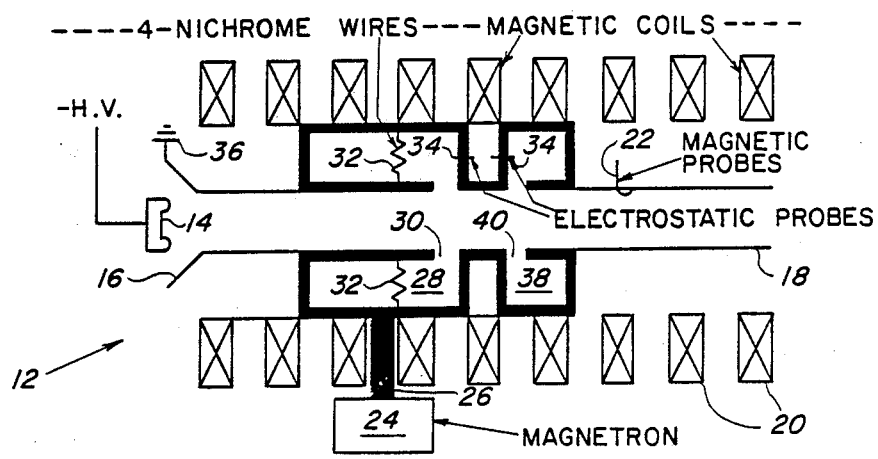
FIG. 2 is a schematic diagram of another combination embodying the invention.
Figure 3A:
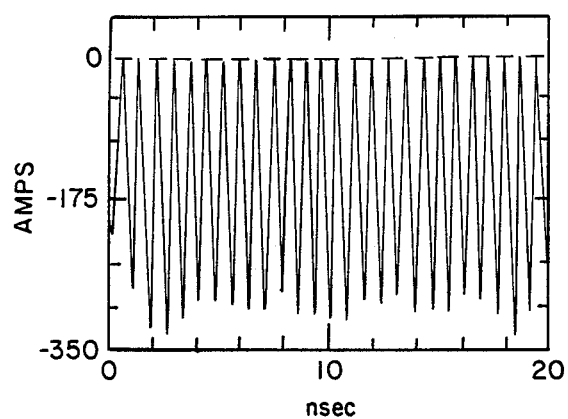
FIG. 3 is comprised of FIG. 3a, 3b, 3c, and 3d and shows experimental results obtained with the combination shown in FIG. 1.
Figure 3B:
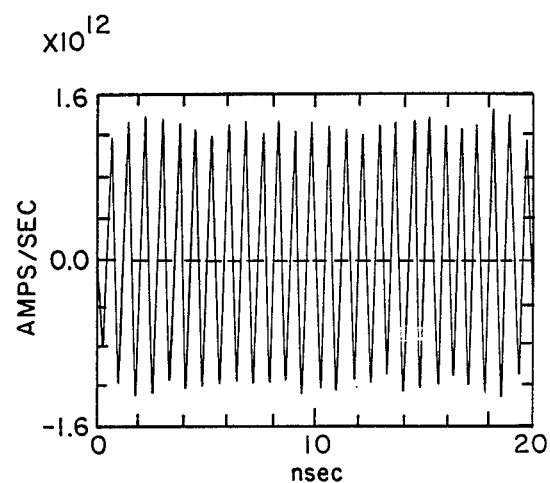
Figure 3C:
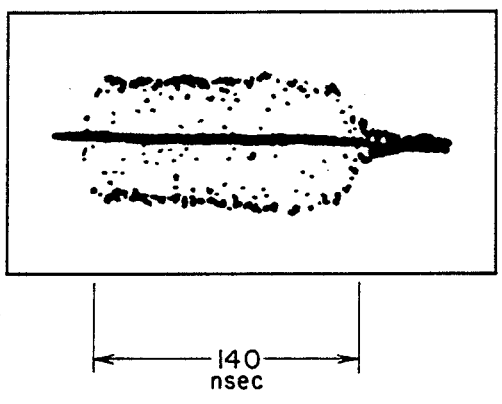
Figure 3D:
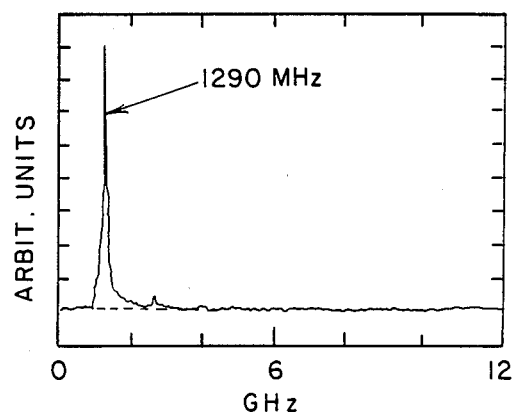

FIG. 2 schematically represents a second apparatus 12 containing the same elements found in the first apparatus 10 and, in addition, another annular RF cavity 38, an associated circular gap 40 coupling the cavity 36 to the drift region in the tube 18, and another electrostatic probe 34.

The apparatus 10 and 20 in the overall include, in combination, a radio frequency source 24 providing an input signal of specified frequency, a drift tube 18 with magnetic coils 20 and an electron beam source (i.e. cathode 14 and anode 16) coacting to form an intense relativistic electron beam (IREB) propagating along a drift region in the drift tube 18, an RF cavity 28 coaxial with the drift region, a circular gap 30 interconnecting the cavity 28 to the IREB in the drift region, and a waveguide 26 coupling the RF source 24 to the RF cavity 28.

The RF source 24 is, but need not be, a magnetron, operating at 1.328 Gigahertz. The impedance elements 32 serve to suppress the fundamental resonance of the cavity which is dimensioned so that the third harmonic of the cavity resonance frequency corresponds exactly to the frequency of the RF source 24.

In the second apparatus 12, the RF cavity 36 is dimensioned so that the fundamental (first) harmonic of the cavity resonance frequency corresponds exactly to the frequency of the RF source 24.

In the apparatus 10 the IREB is modulated at the gap 30, the percent modulation of the beam is about 5–10 percent at the gap 30. In the apparatus 12 the IREB is modulated at the gaps 30 and 40, the percent modulation of the beam is about 80–200 percent. Accordingly, beam modulation at gap 40 is considerably higher than at gap 30.

The invention provides a combination useful in a high power ($10^9$ Watts), high-efficiency (50%) RF amplifier with a gain of about 40 dB, operating in the frequency range up to 10 GHz.

The apparatus shown in FIG. 1 consists of a diode (14,16) emitting an annular IREB of radius $r_b \simeq 1.9$ cm and thickness 0.3 cm. A 10 kgauss quasi d.c. magnetic field from coil 20 confines the IREB inside a metal tube 18 of radius $rw \simeq 2.35$ cm. The gap 30 feeds RF energy from the coaxial cavity 28 to the IREB in the drift tube 18. The characteristic impedance of the cavity 28 is $Z = 45$ ohms and its length $L = 17$ cm and corresponds to a resonance frequency of 410 MHz. Four thin nichrome wires 32 connect the inside cavity wall to the outside cavity wall. The wires 32 shift the fundamental first resonance frequency of the cavity 28 from 410 MHz to 610 MHz. The external RF source 24 (e.g. a magnetron) pumps microwave energy into the cavity for a duration of 3 microseconds at a frequency $f = 1328$ megahertz. During this 3 $\mu$sec period a Blumlein transmission line (not shown) with an output of 500 kV energizes the diode (14, 16) for 120 sec, launching a $\sim 5$ kA electron beam through the drift region. Base pressure in the tube's drift region is $\leq 10^{-5}$ Torr. The electron beam is diagnosed by the magnetic probes 22. The voltage at the gap of the cavity 28 is measured by the electrostatic probe 34. The various probes 22, 34 are calibrated at different frequencies (up to 1.3 28 GHz). A Tektronix digitizer system analyzes the RF signal imposed on the IREB.

The dI/dt signal carried by the modulated IREB is Fourier analyzed and integrated to obtain the A.C. oscillation and current profile. FIG. 3 shows examples of the spectra and current profiles.

A summary of results for the FIG. 1 apparatus is given below:

(1) The input power injected into the cavity is 50–100 kW at 1.328 GHz. With this power a voltage of $\sim 5$ kV is generated at the gap.

(2) Modulation of the current of the IREB is observed at a distance of 5 centimeters from the gap 30 of the cavity 28 and remains constant during the 120 nanoseconds of the IREB propagation. (FIG. 3).

(3) The depth of current modulation is $\sim 5\%$ at 5 cm. downstream from the gap 30 in the beam propagation direction, increases to a maximum of 10% at 30 cm. and drops back to 5% at a distance of 55 cm downstream of the gap 30.

(4) The phase variation and the frequency of the modulation is measured by mixing the magnetic probe signal with the driving RF signal. The phase varies less than 4 degrees during the pulse duration and the frequency is equal to the driver frequency. The phase difference between the signals of the input and the cavity 28 do not change on successive pulses.

Figure 4A:
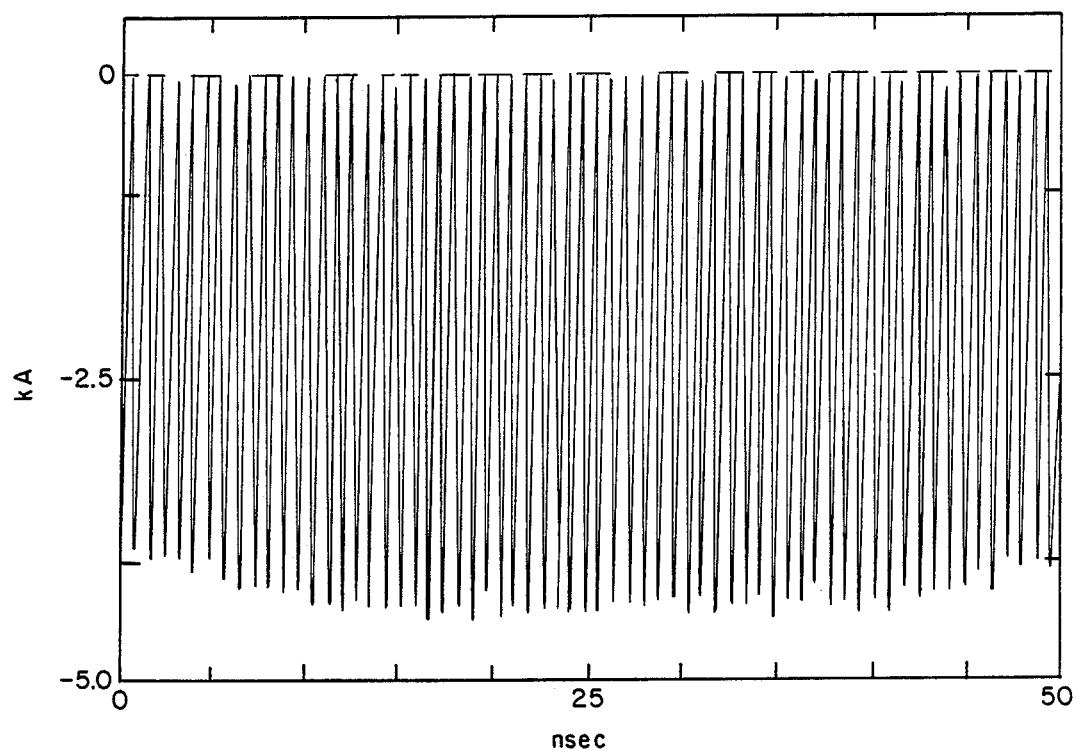
FIG. 4 is comprised of FIG. 4a and FIG. 4b and shows experimental results obtained with the combination shown in FIG. 2.
Figure 4B:
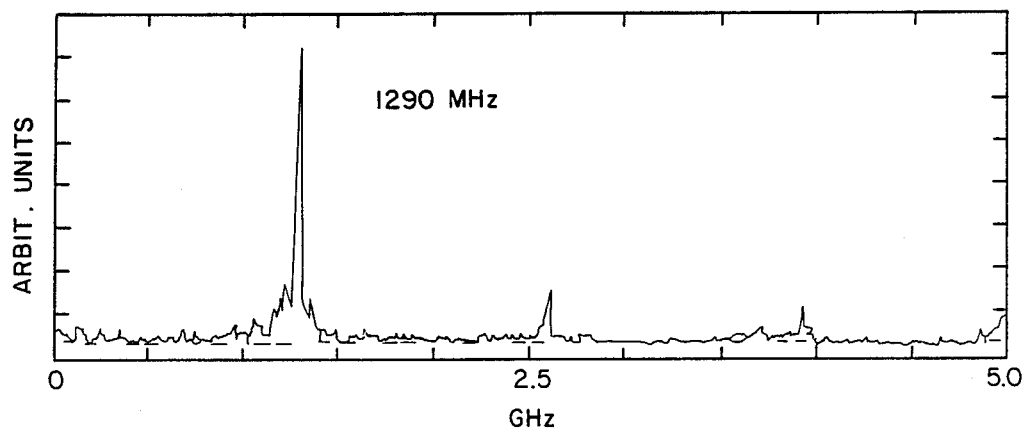

In order to fully modulate the 5 kA IREB of the apparatus 10, one would need to impose on the gap a voltage of $\sim 100$ kV which is equivalent to injecting RF power exceeding 20 MW into the present cavity. Instead, a second cavity 38 and second gap 40 in the drift tube 5 centimeters away from the cavity 28 and gap 30 is utilized, as shown in FIG. 2. The coaxial cavity 38 is tuned to 1328 MHz (the frequency of RF source 24), and has a characteristic impedance of 45 ohms. Voltage oscillations of amplitude $\geq 120$ kV are induced at the second cavity 38 when the partially modulated IREB that emerged from the first cavity 28 traverses it. The IREB emerging from the second cavity 38 is more than 80% modulated at the frequency of 1328 MHz, (FIG. 4). Beam modulation up to 200% has been obtained.

The presence of the gap 30 and/or 40 with the applied voltage influences the maximum IREB current, $I_m$, that can propagate. When the amplitude of voltage $V_g$ at the gap 30 and/or 40 is small the apparatus will behave like a class "A" amplifier, when $V_g$ is large the system will behave like a class "B" amplifier.

The kinetic energy of a modulated IREB can be converted into RF energy with high efficiency (50%). Hence, an RF amplifier based on this invention will have a gain of $\geq 40$ db measured by comparing the RF power at gap 28 with the RF power in the modulated IREB.

In accordance with this invention an RF 24 source modulates an IREB $10^4$–$10^5$ times higher in power. The IREB modulation frequency can go up to $\geq 10$ GHz and be amplified with similar gain and power levels by using RF power sources other than the magnetron used at the frequency $f = 1.328$ Gigahertz.

The invention described above is based on a combination of elements capable of partially (FIG. 1) or (FIG. 2) completely modulating an intense relativistic electron beam (IREB) of power $\geq 10^9$–$10^{10}$ watts. Monochromatic RF energy at a power level of $\sim 1$ Gigawatt was extracted from a bunched electron beam at various frequencies between 60 MHz and 3 GHz. This combination can be used to construct a high-power, high efficiency RF amplifier. The interaction between an IREB and an externally generated RF energy leads to a large amplitude monochromatic and coherent oscillation on the IREB current. This beam modulation is used to generate high power microwave pulses by extracting RF energy from the beam.

Obviously many modifications and variations of the present invention are possible in light of the above teachings. It is therefore to be understood that within the scope of the appended claims the invention may be practiced otherwise than as specifically described.

We claim:

1. An apparatus adapted for amplifying an input signal of a particular radio frequency, said apparatus being a multi-gigawatt RF amplifier comprising:

radio frequency source providing a signal of specified frequency;

a drift tube region where a magnetic field and an electron beam form an intense relativistic electron beam, characterized by currents in or above the kiloampere range, propagating along the drift tube region;

an annular radio frequency cavity around a portion of the drift tube region and a circular gap interconnecting said cavity to the beam propagating in the drift region, the cavity being dimensioned for resonance at the frequency of the source; and means coupling said radio frequency source to said cavity so that energy from the source reaches the beam only at the gap where interaction of the energy with the beam produces beam current modulation at the frequency of the source.

2. The apparatus set forth in claim 1 wherein said radio frequency source operates at a frequency up to 10 Gigahertz.

3. The apparatus set forth in claim 2 wherein the source is a magnetron.

4. The apparatus set forth in claim 1 wherein the source is connected to the cavity by a waveguide serving as the coupling means.

5. The apparatus set forth in claim 1 wherein said cavity contains symmetrically arranged resistive impedance elements coupled between innermost and outermost cavity walls.

6. The apparatus set forth in claim 1 further comprising a second annular radio frequency cavity around a second portion of the drift tube region and a second circular gap interconnecting said second cavity to the beam in the drift tube region downstream from the location where the first gap couples the first cavity to the beam, the second cavity being dimensioned for resonance at the frequency of the source.

7. The apparatus set forth in claim 6 wherein the beam modulation at the second gap is considerably higher than the beam modulation at the first gap.

8. The apparatus set forth in claim 1 wherein said intense relativistic electron beam is of annular configuration.

9. An apparatus adapted for amplifying an input signal of a particular radio frequency, said apparatus being a multi-gigawatt RF amplifier comprising:
   a radio frequency source providing a signal of specified frequency;
   a drift tube region where a magnetic field and an electron beam source form an intense relativistic electron beam, characterized by currents in or above the kiloampere range, propagating along the drift tube region;
   an annular radio frequency cavity around a portion of a drift tube region and a circular gap interconnecting said cavity to the beam propagating in the drift region, the cavity being dimensioned for resonance at the frequency of the source; and
   means coupling said radio frequency source to said cavity so that energy from the source reaches the beam only at the gap where interaction of the energy with the beam produces beam current modulation at the frequency of the source; and
   a second annular radio frequency cavity around a second portion of the drift tube region and a circular gap interconnecting said second cavity to the beam at the drift tube region downstream from the location where the first gap couples the first cavity to the beam, the second cavity being dimensioned for resonance at the frequency of the source.

10. The apparatus set forth in claim 9 wherein the beam modulation at the second gap is considerably higher than the beam modulation at the first gap.

11. The apparatus set forth in claim 9 wherein said intense relativistic electron beam is of annular configuration.

12. An apparatus adapted for amplifying an input signal of a particular radio frequency from a radio frequency source providing a signal of specified frequency, the apparatus being a multi-gigawatt RF amplifier comprising:
   a drift tube region where a magnetic field and an electron beam form an intense relativistic electron beam, characterized by currents in or above the kiloampere range, propagating along the drift tube region;
   an annular radio frequency cavity around a portion of the drift tube region and a circular gap interconnecting said cavity to the beam propagating in the drift region, the cavity being dimensioned for resonance at the frequency of the source; and
   means coupling said radio frequency source to said cavity so that energy from the source reaches the beam only at the gap where interaction of the energy with the beam produces beam current modulation at the frequency of the source.

13. The apparatus set forth in claim 12 wherein said intense relativistic electron beam is of annular configuration.

14. The apparatus set forth in claim 12 wherein said apparatus operates at a frequency up to 10 Gigahertz.

15. The apparatus set forth in claim 14 combined with a radio frequency source that operates at a frequency up to 10 Gigahertz.

16. The apparatus set forth in claim 12 further comprising a second annular radio frequency cavity around a second portion of the drift tube region and a second circular gap interconnecting said second cavity to the beam in the drift tube region downstream from the location where the first gap couples the first cavity to the beam, the second cavity being dimensioned for resonance at the frequency of the source.

17. The apparatus set forth in claim 12 wherein said cavity contains symmetrically arranged resistive impedance elements coupled between innermost and outermost cavity walls.

18. The apparatus set forth in claim 16 wherein the beam modulation at the second gap is considerably higher than the beam modulation at the first gap.

19. An apparatus adapted for amplifying an input signal of a particular radio frequency from a radio frequency source providing a signal of specified frequency, the apparatus being a multi-gigawatt RF amplifier comprising:
   a drift tube region where a magnetic field and an electron beam source form an intense relativistic electron beam, characterized by currents in or above the kiloampere range, propagating along the drift tube region;
   an annular radio frequency cavity around a portion of the drift tube region and a circular gap interconnecting said cavity to the beam propagating in the drift region, the cavity being dimensioned for resonance at the frequency of the source; and
   means coupling said radio frequency source to said cavity so that energy from the source reaches the beam only at the gap where interaction of the energy with the beam produces beam current modulation at the frequency of the source; and
   a second annular frequency cavity around a second portion of the drift tube region and a circular gap interconnecting said second cavity to the beam at the drift tube region downstream from the location where the first gap couples the first cavity to the beam, the second cavity being dimensioned for resonance at the frequency of the source.

20. The apparatus set forth in claim 19 wherein the beam modulation at the second gap is considerably higher than the beam modulation at the first gap.

21. The apparatus set forth in claim 19 wherein said intense relativistic electron beam is of annular configuration.

* * * * *